US011908769B2

(12) United States Patent
Venkatasubramanian et al.

(10) Patent No.: US 11,908,769 B2
(45) Date of Patent: Feb. 20, 2024

(54) SUPERLATTICE STRUCTURES FOR THERMOELECTRIC DEVICES

(71) Applicant: The Johns Hopkins University, Baltimore, MD (US)

(72) Inventors: Rama Venkatasubramanian, Cary, NC (US); Jonathan M. Pierce, Eldersburg, MD (US); Geza Dezsi, Durham, NC (US)

(73) Assignee: The Johns Hopkins University, Baltimore, MD (US)

( * ) Notice: Subject to any disclaimer, the term of this patent is extended or adjusted under 35 U.S.C. 154(b) by 592 days.

(21) Appl. No.: 17/132,640

(22) Filed: Dec. 23, 2020

(65) Prior Publication Data

US 2021/0151360 A1    May 20, 2021

Related U.S. Application Data

(63) Continuation of application No. 15/700,263, filed on Sep. 11, 2017, now Pat. No. 10,903,139.

(60) Provisional application No. 62/420,815, filed on Nov. 11, 2016.

(51) Int. Cl.
| | |
|---|---|
| H01L 23/38 | (2006.01) |
| H10N 10/01 | (2023.01) |
| H10N 10/13 | (2023.01) |
| H10N 10/17 | (2023.01) |
| H10N 10/81 | (2023.01) |
| H10N 10/852 | (2023.01) |
| H01L 33/64 | (2010.01) |

(52) U.S. Cl.
CPC ............ *H01L 23/38* (2013.01); *H10N 10/01* (2023.02); *H10N 10/13* (2023.02); *H10N 10/17* (2023.02); *H10N 10/81* (2023.02); *H10N 10/852* (2023.02); *H01L 33/645* (2013.01)

(58) Field of Classification Search
CPC . H01L 23/38; H01L 33/645; H01L 27/14613; H10N 10/852; H10N 10/81; H10N 10/13; H10N 10/01
USPC .......................................................... 257/15
See application file for complete search history.

(56) References Cited

U.S. PATENT DOCUMENTS

2015/0340445 A1* 11/2015 Choi et al. ............. H01L 29/36

* cited by examiner

*Primary Examiner* — Thinh T Nguyen
(74) *Attorney, Agent, or Firm* — Sung T. Kim

(57) ABSTRACT

Example superlattice structures and methods for thermoelectric devices are provided. An example structure may include a plurality of superlattice periods. Each superlattice period may include a first material layer disposed adjacent to a second material layer. For each superlattice period, the first material layer may be formed of a first material and the second material layer may be formed of a second material. The plurality of superlattice periods may include a first superlattice period and a second superlattice period. A thickness of a first material layer of the first superlattice period may be different than a thickness of a first material layer of the second superlattice period.

10 Claims, 10 Drawing Sheets

SUPERLATTICE STRUCTURES FOR THERMOELECTRIC DEVICES

CROSS-REFERENCE TO RELATED APPLICATIONS

This application is a Continuation patent application of U.S. patent application Ser. No. 15/700,263, filed on Sep. 11, 2017, which claims priority to U.S. Provisional Application No. 62/420,815 filed on Nov. 11, 2016, which are incorporated herein by reference in their entirety.

STATEMENT REGARDING FEDERALLY SPONSORED RESEARCH OR DEVELOPMENT

This invention was made with Government support under contract number HR0011-16-C-0011 awarded by the Defense Advanced Research Projects Agency. The Government has certain rights in the invention.

TECHNICAL FIELD

Example embodiments generally relate to material structures and, more particularly, relate to engineered thin-film superlattice structures.

BACKGROUND

Application of solid state thermoelectric cooling is expected to improve the operation of high-performance electronics including microprocessors, optoelectronics (e.g., lasers, light emitting diodes (LEDs), infrared (IR) imagers, etc.), radio frequency (RF) electronics (e.g., communication devices in smartphones and satellites, radio frequency receiver front-ends), superconducting electronics, and sensors (e.g., ultra-sensitive magnetic signature sensors, etc.). The effectiveness of conventional thermoelectric cooling structures has been limited, particularly when cooling functionality is required in environments where the temperature may vary, in some instances significantly. As temperatures vary, often away from room temperature, the performance of conventional thermoelectric cooling structures can be limited and possibly become ineffective or less attractive.

BRIEF SUMMARY OF SOME EXAMPLES

An example thin-film structure may comprise a plurality of superlattice periods. Each superlattice period may comprise a first material layer disposed adjacent to a second material layer. For each superlattice period, the first material layer may be formed of a first material and the second material layer may be formed of a second material. The first material may be different from the second material. The plurality of superlattice periods may comprise a first superlattice period and a second superlattice period. A thickness of a first material layer of the first superlattice period may be different than a thickness of a first material layer of the second superlattice period.

An example method may comprise growing a buffer layer on a crystalline substrate. The example method may further comprise forming a plurality of superlattice periods by Metal-Organic Chemical Vapour Deposition (MOCVD) or by Molecular Beam Epitaxy (MBE) on the buffer layer. Each superlattice period may comprise a first material layer disposed adjacent to a second material layer. For each superlattice period, the first material layer may be formed of a first material and the second material layer may be formed of a second material. The plurality of superlattice periods may comprise a first superlattice period and a second superlattice period.

Another example structure may comprise a plurality of superlattice periods. Each superlattice period may comprise a first material layer disposed adjacent to a second material layer. For each superlattice period, the first material layer may be formed of $Bi_2Te_3$ and the second material layer may be formed of $Sb_2Te_3$ or $Bi_2Te_{3-x}S_{ex}$. The plurality of superlattice periods may comprise a first superlattice period wherein a thickness of a first material layer of the first superlattice period is x and a thickness of a second material layer of the first superlattice period is 3x. The plurality of superlattice periods may further comprise a second superlattice period disposed adjacent the first superlattice period, wherein a thickness of a first material layer of the second superlattice period is x and a thickness of a second material layer of the second superlattice period is 4x. The plurality of superlattice periods may further comprise a third superlattice period disposed adjacent the second superlattice period, wherein a thickness of a first material layer of the third superlattice period is x and a thickness of a second material layer of the third superlattice period is 5x. The plurality of superlattice periods may further comprise a fourth superlattice period disposed adjacent the third superlattice period, wherein a thickness of a first material layer of the fourth superlattice period is x and a thickness of a second material layer of the fourth superlattice period is 6x. The plurality of superlattice periods may further comprise a fifth superlattice period disposed adjacent the fourth superlattice period, wherein a thickness of a first material layer of the fifth superlattice period is x and a thickness of a second material layer of the fifth superlattice period is 7x.

BRIEF DESCRIPTION OF THE SEVERAL VIEWS OF THE DRAWING(S)

Having thus described some the example embodiments in general terms, reference will now be made to the accompanying drawings, which are not necessarily drawn to scale, and wherein:

DETAILED DESCRIPTION

Figure 1:
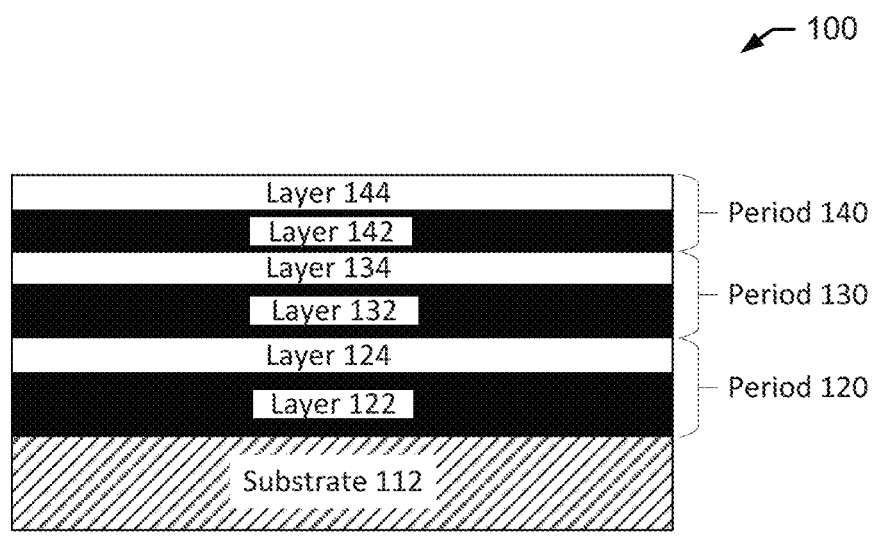
FIG. 1 shows an example superlattice structure according to an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability, or configuration of the present disclosure. Rather, these example embodiments are provided so that this disclosure will satisfy applicable legal requirements. Like reference numerals refer to like elements throughout.

As used herein the term "or" is used as the logical or where any one or more of the operands being true results in the statement being true. As used herein, the phrase "based on" as used in, for example, "A is based on B" indicates that B is a factor that determines A, but B is not necessarily the only factor that determines A.

According to various example embodiments, new examples of thin-film nano-scale superlattice structures, and methods of forming the same are described herein. Due to certain characteristics of the example structures, according to some example embodiments, the example structures may be referred to as a controlled hierarchical engineered superlattice structure (CHESS). One benefit of these structures is that the structures can exhibit a large thermoelectric figure of merit (ZT), which is a function of the Seebeck coefficient $\alpha$, thermal conductivity $\kappa$, electrical conductivity $\sigma$, and temperature T:

$$ZT = (\alpha^2 \sigma T)/\kappa$$

Structures having a large ZT may be used in a myriad of applications related to cooling of electronics, photonics, infrared-reconnaissance platform technologies, and the like. According to some example embodiments, structures having a ZT greater than 2.5 to 3 can be operated in the temperature ranges of 400K-100K for cooling purposes. The 400K range can be representative of a temperature that would be highly beneficial to electronic circuitry that operates near 100° C. in many modern day microprocessors, and the 100K range may be highly beneficial to the cooling needs of infra-red detectors, superconducting electronics, etc. The near 300K range for cooling or thermal control/management may prove to be highly beneficial in biological systems like polymerase chain reaction (PCR) and bio-diagnostics, to HVAC (heating, ventilation, and air conditioning), and to refrigeration.

Structures having such high ZT values will have a highly significant impact in a variety of applications where the structures may have a solid state thermoelectric cooling efficiency approaching that of mechanical HVAC systems and yet, the structures retain advantages in weight, volume, compactness, speed and solid state reliability. The applications for such CHESS structures include, but are not limited to, electronics cooling, laser/LED cooling, cooling biological samples, and cryogenic coolers for infrared platforms and superconducting devices.

In this regard, according to various example embodiments, an example CHESS structure is provided as superlattice structure 100 of FIG. 1. In this regard, the superlattice structure 100 may be comprised of a plurality of periods (or superlattice periods) 120, 130, 140 disposed on a substrate 112. Each of the periods 120, 130, 140 may have two layers (bi-layer periods), where a first material (e.g., $Bi_2Te_3$) comprises the first layer and a second material (e.g., $Sb_2Te_3$) comprises the second layer. In this regard, period 120 may comprise layers 122 and 124, period 130 may comprise layers 132 and 134, and period 140 may comprise layers 142 and 144. The materials of each layer may be, for example, semiconductor materials and may be doped p-type or n-type. Further, each layer may be formed to have a certain, predetermined thickness, and the thickness of the layers may cause the superlattice structure 100 to have certain characteristics including thermoelectric characteristics. Additionally, according to some example embodiments, a superlattice structure may comprise a series of periods that are repeated within the superlattice structure, where such a series of periods is referred to as a band. In a CHESS structure, a band may be reproduced and repeated a number of times, possibly to reach a desired thickness for the structure (e.g., 3 to 30 microns). Further, such CHESS structures may be used in forming a thermoelectric cooler (or thermoelectric module). According to some example embodiments, such a thermoelectric cooler may be a structure having one or more p-n couples, where each p or n element (also referred to as a leg) of the couples may be a CHESS structure. P-type materials for CHESS structures may include $Bi_2Te_3$, $Sb_2Te_{3-x}$ $Bi_{2-x}Sb_xTe_3$, PbTe, PbSe, SnTe, SnSe, Si, Ge, $Si_{1-x}Ge_x$, GeTe, $Bi_xSb_{1-x}$, or SrTe, depending on temperatures of interest (e.g., 77K to 600K). Further, n-type materials for CHESS structures may include $Bi_2Te_3$, $Bi_2Se_3$, $Bi_2Se_xTe_{3-x}$, PbTe, PbSe, SnTe, SnSe, Si, Ge, $Si_{1-x}Ge_x$, GeTe, $Bi_xSb_{1-x}$, or SrTe depending on temperatures of interest (e.g., 77K to 600K).

An example CHESS structure, such as superlattice structure 100, may be formed via various techniques, such as thin-film growth techniques. For example, according to some example embodiments, a CHESS structure may be formed using Metal-Organic Chemical Vapour Deposition (MOCVD) or by Molecular Beam Epitaxy (MBE). Such techniques may be used to form superlattice periods (e.g., periods 120, 130, 140) of varying thicknesses, in a controllable and reliable format. According to some example embodiments, such superlattice periods may be formed such that the periods, alone or in combination, scatter a range of phonon wavelengths. In this regard, the structures may be sized to have, for example, thicknesses that are similar or comparable to phonon wavelengths, and thereby may embody a highly effective scattering mechanism. Such sizing may be performed in consideration of the principle that long wavelength phonons tend to be scattered, in the Rayleigh scattering mode, more effectively when the superlattice periods are similar or comparable to the wavelength of phonons of interest. Optimization of a CHESS structure, in this regard, may rely on creating controlled hierarchical superlattice periods of varying thicknesses to match, for example, dominant heat-conducting phonon wavelengths, at different temperatures, to achieve a low lattice thermal conductivity, while also providing an optimal bandgap and maximizing electron transport for maximizing power factor (PF).

As such, Table 1 provides an example CHESS structure and provides context for the variety of alternative CHESS structures associated with the additional tables below and the concepts provided otherwise herein. In Table 1, Layer A is a first layer of a given period and Layer B is a second layer of the given period. Further, the structure described with respect to Table 1 may be either a p-type or n-type structure. In this regard, for a p-type structure, for example, Layer A may be formed of $Bi_2Te_3$ and Layer B may be formed of $Sb_2Te_3$. For an n-type structure, for example, Layer A may be formed of $Bi_2Te_3$ and Layer B may be formed of $Bi_2Te_{3-x}Se_x$.

TABLE 1

| Total Superlattice Period Thickness (nm) | Layer A Thickness (nm) | Layer B Thickness (nm) |
|---|---|---|
| 4 | 1 | 3 |
| 5 | 1 | 4 |

TABLE 1-continued

| Total Superlattice Period Thickness (nm) | Layer A Thickness (nm) | Layer B Thickness (nm) |
|---|---|---|
| 6 | 1 | 5 |
| 7 | 1 | 6 |
| 8 | 1 | 7 |

Figure 2:
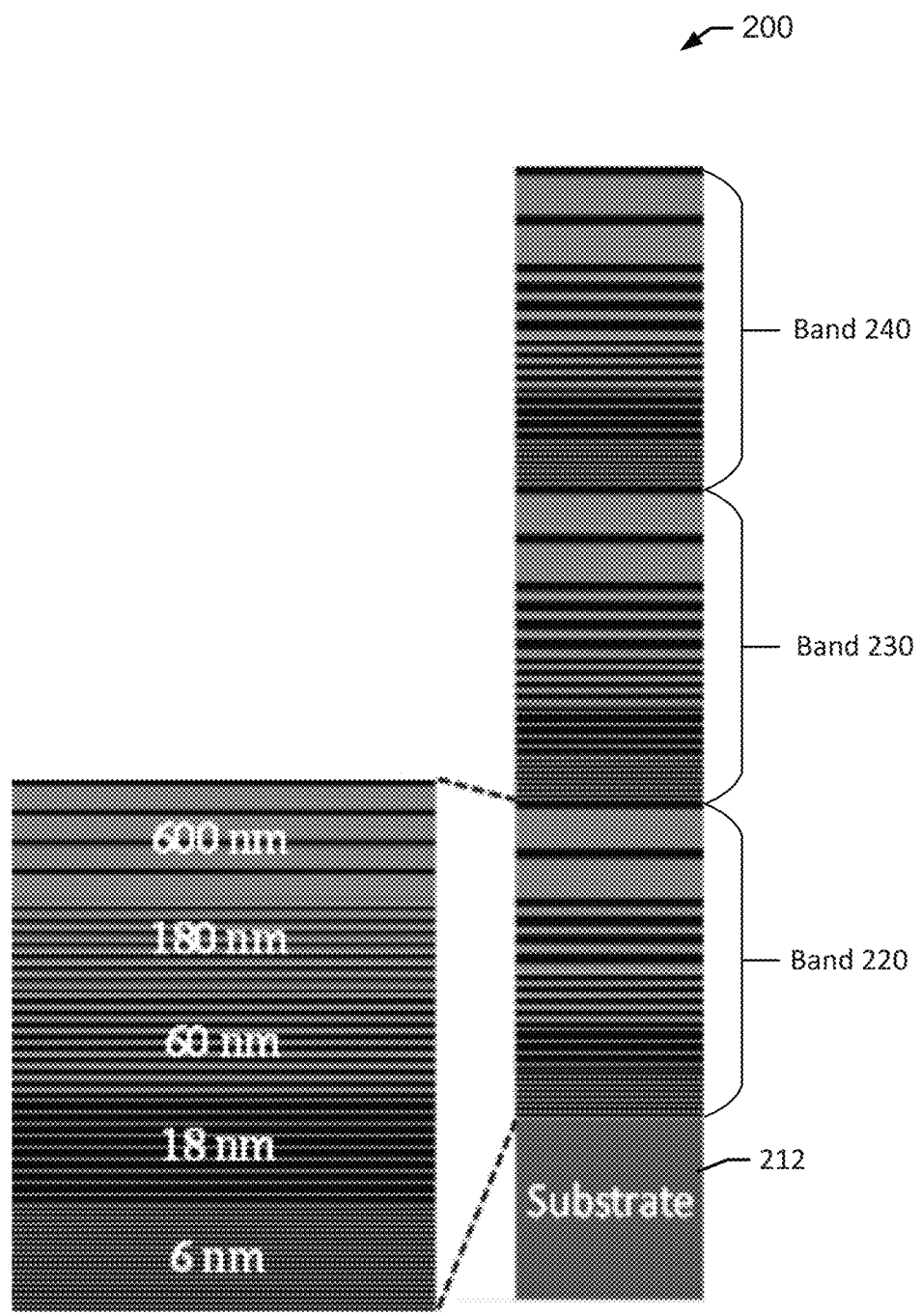
FIG. 2 shows another example superlattice structure according to an example embodiment.

In consideration of the foregoing, a CHESS structure in the form of superlattice structure 200 shown in FIG. 2 may be formed having repeating bands of superlattice periods. In this regard, the superlattice structure 200 may have three (3) bands 220, 230, and 240 formed on a substrate 212. The bands 220, 230, and 240 may be a series of superlattice periods having layers of a particular thickness. According to some example embodiments, each of the bands 220, 230, and 240 may be identical or substantially identical in consideration of formation tolerances. According to some example embodiments, the substrate 212 may comprise GaAs and all of the layers of the periods may be comprised of materials that are either n-type or p-type. Table 2 provides a description of example thicknesses of the layers for each period within the bands 220, 230, and 240 given a p-type configuration.

TABLE 2

| Total Superlattice Period Thickness (nm) | P-type $Bi_2Te_3$ Thickness (nm) | P-type $Sb_2Te_3$ Thickness (nm) |
|---|---|---|
| 6 | 1 | 5 |
| 18 | 3 | 15 |
| 60 | 10 | 50 |
| 180 | 30 | 150 |
| 600 | 100 | 500 |

Table 3 provides a description of example thicknesses of the layers for each period within the bands 220, 230, and 240 given an n-type configuration.

TABLE 3

| Total Superlattice Period Thickness (nm) | N-type $Bi_2Te_3$ Thickness (nm) | N-type $Bi_2Te_{3-x}Se_x$ Thickness (nm) |
|---|---|---|
| 6 | 1 | 5 |
| 18 | 3 | 15 |
| 60 | 10 | 50 |
| 180 | 30 | 150 |
| 600 | 100 | 500 |

As such, due to the thicknesses of the periods within the bands 220, 230, and 240 of the superlattice structure 200, the superlattice structure 200 may be able to scatter phonon wavelengths from a few nanometers (nm) to 600 nm or more. Accordingly, such controlled hierarchical superlattice structures in thin-film materials (e.g., superlattice structure 200), in contrast to uncontrolled hierarchical bulk nanostructures, can achieve control of nano-scale phonon, electron, and energy transport for higher ZT—particularly across various temperatures.

Tables 4 and 5 describe other example CHESS structures, according to some example embodiments, as p-type structures formed via MOCVD or MBE and n-type structures formed via MBE or MOCVD, respectively. Like Tables 1, 2 and 3, Tables 4 and 5 describe a band of periods that may be repeated, for example, three (3) times in a given superlattice structure to form a structure with a total film thickness between about 3 and 30 microns.

TABLE 4

| Total Superlattice Period Thickness (nm) | MOCVD P-type $Bi_2Te_3$ Thickness (nm) | MOCVD P-type $Sb_2Te_3$ Thickness (nm) |
|---|---|---|
| 6 | 1 | 5 |
| 12 | 2 | 10 |
| 18 | 3 | 15 |
| 24 | 4 | 20 |
| 30 | 5 | 25 |

TABLE 5

| Total Superlattice Period Thickness (nm) | MBE N-type $Bi_2Te_3$ Thickness (nm) | MBE N-type $Bi_2Se_3$ Thickness (nm) |
|---|---|---|
| 6 | 1 | 5 |
| 12 | 2 | 10 |
| 18 | 3 | 15 |
| 24 | 4 | 20 |
| 30 | 5 | 25 |

These example superlattice structures can more effectively scatter phonons and lower thermal conductivity κ in thermoelectric materials and may also temperature tune structures for phonon scattering for, for example, phonons that conduct heat at various temperatures and change based on temperature.

The example CHESS structures described herein may be related to nano-scale structures having all periods with associated layers formed as 1 nm/5 nm p-type $Bi_2Te_3$/$Sb_2Te_3$ resulting in ZT of approximately 2.4 at 300K. However, unlike these structures, the example CHESS structures described herein, according to various example embodiments, can exhibit low thermal conductivities and high ZT across a broad range of temperatures. For example, according to some example embodiments, a CHESS structure may have a thermal conductivity of about 0.05 to 2 Watts per meter Kelvin at temperatures ranging from about 300 Kelvin to 70 Kelvin.

Additionally, Tables 6 and 7 provide other example CHESS structures where Layer A is a first layer of a given period and Layer B is a second layer of the given period. The structure of Table 6 may represent a single band of the structure, which could have multiple bands that are repeated to form a larger CHESS structure. According to some example embodiments, a CHESS structure may be formed that includes multiple adjacent bands based on the structure of Table 1, then, on top, multiple adjacent bands based on the structure of Table 6, and finally, then, on top, multiple adjacent bands based on the structure of Table 7. The example embodiments show that a variety of CHESS structures may be formed, for example, through reliance of continuously engineering layers and periods of various thicknesses for optimal phonon blocking and bandgap characteristics along the thickness and an associated temperature gradient.

TABLE 6

| Total Superlattice Period Thickness (nm) | Layer A Thickness (nm) | Layer B Thickness (nm) |
|---|---|---|
| 5 | 2 | 3 |
| 6 | 2 | 4 |
| 7 | 2 | 5 |

TABLE 6-continued

| Total Superlattice Period Thickness (nm) | Layer A Thickness (nm) | Layer B Thickness (nm) |
|---|---|---|
| 8 | 2 | 6 |
| 9 | 2 | 7 |

TABLE 7

| Total Superlattice Period Thickness (nm) | Layer A Thickness (nm) | Layer B Thickness (nm) |
|---|---|---|
| 6 | 3 | 3 |
| 7 | 3 | 4 |
| 8 | 3 | 5 |
| 9 | 3 | 6 |
| 10 | 3 | 7 |

As exemplified by the example CHESS structures described herein, according to some example embodiments, such structures can be formed having superlattice periods of varying thicknesses and associated layers of varying thicknesses, in a controllable and reliable format, to obtain a structure that scatters a range of phonons. In this manner, the example CHESS structures can exhibit increased ZT greater than 2.8 near 300K, in both p-type $Bi_2Te_3/Sb_2Te_3$ superlattice structures using MOCVD and in n-type $Bi_2Te_3/Bi_2Se_3$ superlattice structures using MBE. Further, such structures may exhibit a ZT of greater than 1.5 near 140K. As stated above, and otherwise herein, these results can be achieved by creating controlled hierarchical superlattice periods of varying thicknesses to match the dominant heat-conducting phonon wavelengths (or half wavelengths) at lower temperatures for the lowest lattice thermal conductivity attainable—while at the same time ensuring optimal bandgap and doping, for maximizing power factor (PF).

Further, according to some example embodiments, the example CHESS structures may also include functionally graded doping to tailor the materials of the structure for enhanced electrical conductivity ci in association with the Seebeck coefficient α. In this regard, an evaluation of the governing equations in a thermoelectric cooler reveals that the Peltier, Seebeck, and Thomson effects are all manifestations of the same thermoelectric property characterized by the Seebeck coefficient α. The Thomson effect describes the heat flow Q when current I flows in the direction of a temperature gradient. The Thomson coefficient r is related to the temperature derivative of the Seebeck coefficient via the Kelvin relations:

$$Q = \tau I \frac{dT}{dx} \quad \tau = T \frac{d\alpha}{dT}$$

Figure 3:
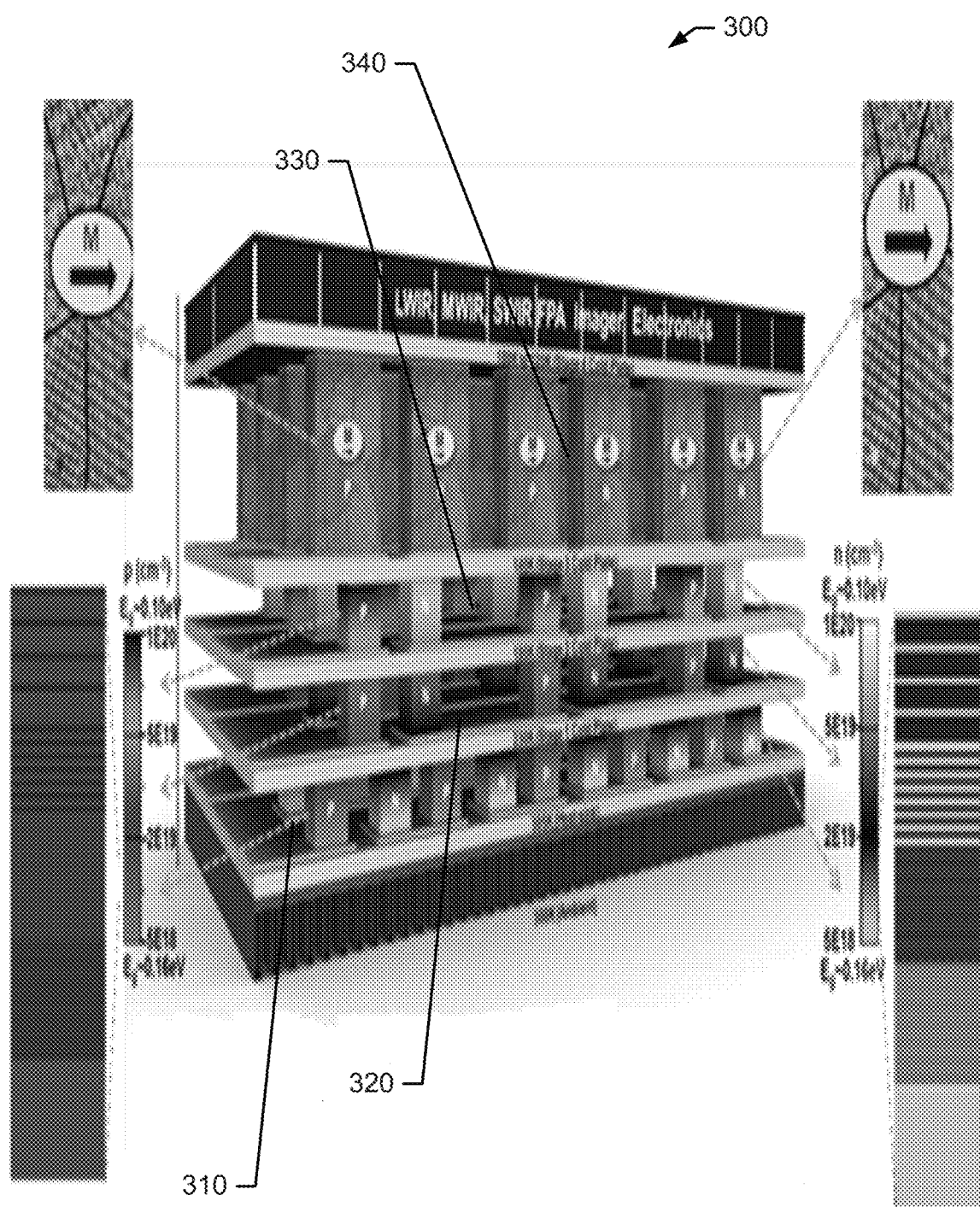
FIG. 3 shows an thermoelectric cooler according to an example embodiment.

In this regard, a viable thermoelectric cooler can have a rapidly changing Seebeck coefficient across the temperature gradient in a leg, leading to a large Thomson coefficient. In contrast, in the traditional constant property model for a Peltier cooler, the Thomson coefficient is by definition zero. However, in the absence of a constant property model, the Thomson effect has proven to be important for thermoelectric cooling. An example of a Thomson cooler 300 which exhibits the transition in properties due to differences in the thicknesses of layers of a CHESS structure is shown in FIG. 3. According to some example embodiments, the thicknesses of the layers, periods, and structure as a whole may be tailored for certain temperature properties, since the temperature can vary over the thickness of the CHESS structure. Accordingly, the cooler 300 may be a four-stage thermoelectric cooler (e.g., stages 310, 320, 330, and 340) that incorporates CHESS structures that may target achieving $T_{cold}$ of approximately 100K, where $T_{cold}$ is a cold side temperature of the cooler 300 (e.g., opposite of the side where heat is present due to an operating chip, laser, bio-platform, superconducting electronics, etc. which may be referred to as the hot side of the cooler 300 $T_{hot}$). As such, $T_{cold}$ may be achieved while also achieving efficiencies that are comparable to mechanical coolers albeit with weight, volume and speed advantages.

Another manner to interpret this same effect can be to consider that, as the temperature is reduced along the length of a leg, the Fermi-level ($E_f$) can move closer to the conduction ($E_c$) or valence band ($E_v$) and can sustain a higher carrier concentration to pin the $E_f$ close to $E_c$ or $E_v$, in n-type or p-type materials, respectively. Accordingly, an optimal location of $E_f$ may be obtained at higher carrier concentration levels and thereby obtain a higher electrical conductivity. Such doping control of semiconductor materials may be achieved by thin-film methods, such as MBE or MOCVD.

Additionally, according to some example embodiments, a CHESS structure may also include a bandgap ($E_g$) gradient. Accordingly, $E_g$ gradient strategies may be developed to primarily mitigate ambipolar effects. For a CHESS structure, $E_g$ may be established to have a magnitude of approximately $6k_BT$, where $k_B$ is the Boltzmann constant and T is the temperature at any arbitrary position within the CHESS structure. When $E_g$ is less than $6k_BT$, then the presence of intrinsic carriers arising from thermal generation may cause ambipolar effects and a degraded Seebeck coefficient. As temperature changes along a leg (e.g., due to cooling), an optimal $E_g$ can change. As such, a continuous $E_g$ variation may be defined within the CHESS material. Using MBE or MOCVD, the $E_g$ can be continuously varied throughout the growth process, for example, for each stage as shown in the cooler 300 of FIG. 3, by continuously adjusting the superlattice period (e.g., the thickness of a first layer of a period relative to the thickness of the second layer of the period). As such, the relative thickness of a Bi2Te3 layer to an Sb2Te3 layer, within a superlattice period, may be adjusted. For example, 1 nm of Bi2Te3 layer and 5 nm of Sb2Te3 layer, for a 6 nm superlattice, may have a bandgap of 0.1636 eV at 300K. However, a 3 nm of Bi2Te3 layer and 3 nm of Sb2Te3 layer, for another superlattice of the same 6 nm period, would have a bandgap of 0.15 eV at 300K.

As such, by modifying the layer thicknesses in a superlattice, a desired bandgap can be achieved. In another example, a 300K-140K bandgap of both p-type and n-type Bi2Te3 may be 0.13-0.09 eV, while a 300K-140K bandgap of p-type Sb2Te3 may be 0.17-0.13 eV, and a 300K-140K bandgap of n-type Bi2Se3 may be approximately 0.3-0.25 eV, respectively. The $E_g$ may be tuned by, for example, isomorphic alloying as well as through selection of superlattice periodicity. Such $E_g$ control may be achieved by thin-film methods, such as, MBE or MOCVD.

Accordingly, CHESS structures as described herein can provide enhanced ZT given by $((\alpha^2 \sigma T)/\kappa)$ not only at 300K but across a temperature range of about 300K to 140K. As such, increased p-n matching at 300K and across the temperature range can be realized, leading to increased and cooling coefficient of performance (COP). In this regard, p-n matching may be a procedure by which the thermal and electrical properties of the p and n CHESS structures (or legs), with respect to each other, in a p-n couple are optimized to maximize cooling efficiency or the CoP of the p-n couple. Additionally, CHESS structures may also be implemented for cooling in the 300K to 400K range, for electronics, photonics and biological platforms.

CHESS structures, as described herein, may be implemented with improved material growth and device design as further described below. In this regard, in-situ doping for improved contact may be implemented according to some example embodiments. For example, in-situ doping for ultra-low resistance ohmic contacts may be utilized to solve and reduce electrical parasitic losses by dramatically reducing electrical resistance between thin-film material layers and current-injection metal contacts. Accordingly, Joule heating may be lowered, thereby achieving higher cooling at the cold-side. Such control may be achieved by thin-film methods, such as, MBE and MOCVD. In MOCVD growth of p-type layers, hole concentrations as high as $1.7E20\ cm^3$ may be attained. In-situ iodine doping during MBE may also offer a straightforward path to extremely high doping densities in n-type layers. Thus, according to some example embodiments, ion-implantation for heavy doping may be avoided, which would potentially create crystalline defects and degrade the Seebeck coefficient from auto-compensation. Instead, epitaxial growth-based doping may be used to achieve the required heavily doped regions in an in-situ fashion.

As mentioned above, MOCVD growth of p-type materials and MBE growth of n-type materials may be used in the formation of a CHESS structure. In this regard, thin-film p-type $Bi_2Te_3/Sb_2Te_3$ and related CHESS structures may be formed by MOCVD, and thin-film n-type $Bi_2Te_3/Bi_2Se_3$ and related CHESS structures may be formed by MBE or MOCVD. The MOCVD of p-type $Bi_2Te_3/Sb_2Te_3$ thin-film materials may be used for the heavy doping needed for in-situ-grown layers for improved contacts.

Figure 4:
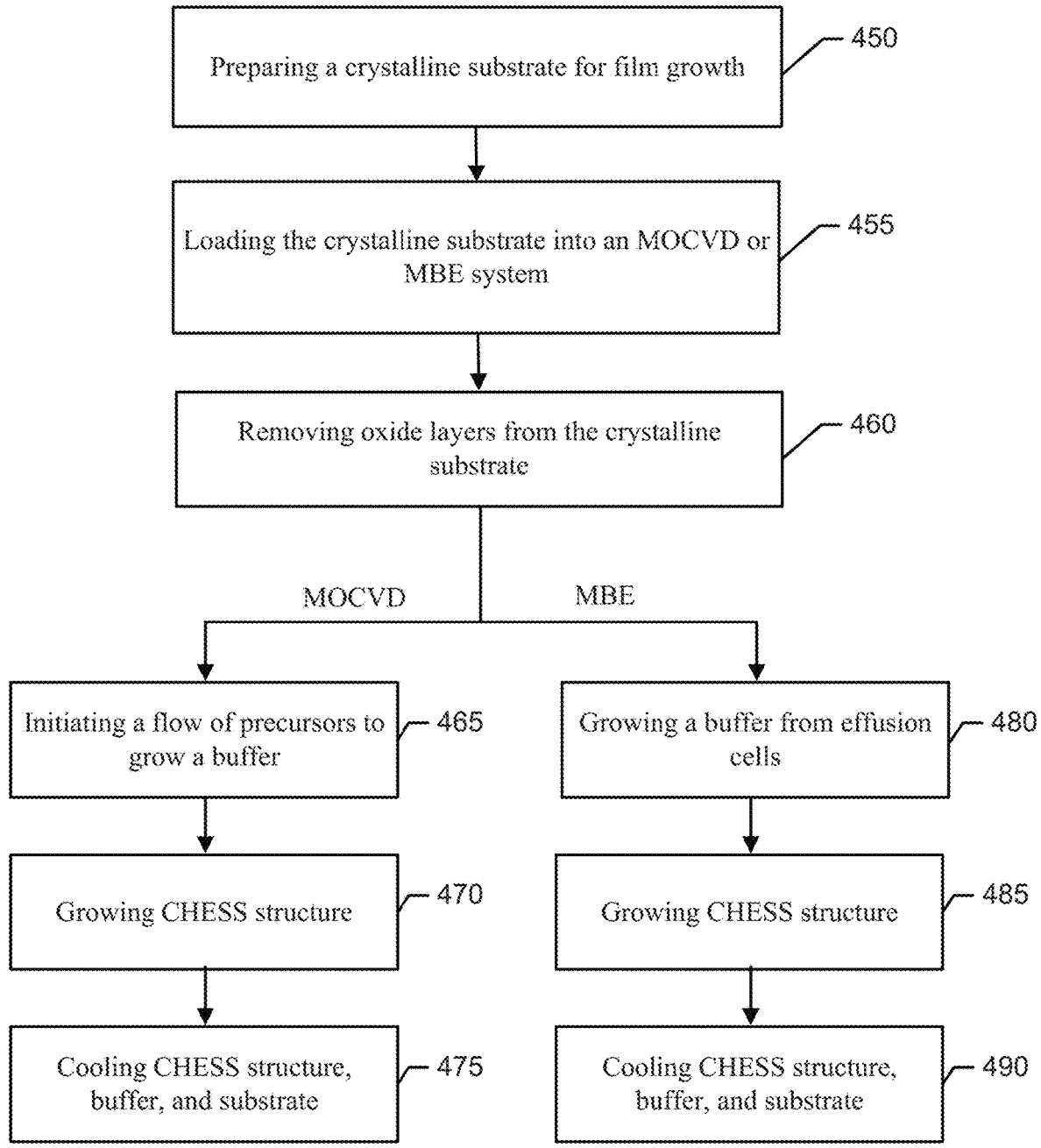
FIG. 4 shows an example method of forming a structure according to an example embodiment.

FIG. 4 provides an example method for forming a CHESS structure in accordance with some example embodiments. In this regard, the example method may include preparing a crystalline substrate (e.g., GaAs) for film growth at 450. Preparation of the substrate may involve, according to some example embodiments, cleaning and conditioning of the substrate via a wet cleaning or plasma cleaning process in preparation for thin-film deposition. Subsequently, the crystalline substrate may be loaded into an MOCVD or MBE system at 455. At 460, any residual or unintentional oxide layers of the crystalline substrate may be removed via thermal deposition in, for example, the temperature range of about 400 C to 550 C.

In the case of MOCVD, at 465, the example method may include initiating flow of organometallic precursors such as di-isopropyl telluride followed by trimethyl bismuth at temperatures such as 350 C to grow a $Bi_2Te_3$ buffer (or buffer layer) having a thickness of, for example, 200 nm. According to some example embodiments, the buffer may have a thickness of about 100 nm to 500 nm and may be, for example, formed of $Bi_2Te_3$. Further, at 470, the CHESS structure may be grown and the thickness of the CHESS structure may be between about 3 and 30 microns. At 475, the CHESS structure, buffer, and the substrate may be permitted to cool.

In the case of MBE, the example method may include, at 480, growing, with Te and Bi, a $Bi_2Te_3$ buffer (or buffer layer) from respective effusion cells, where the buffer may have a thickness of about 200 nm. According to some example embodiments, the buffer may have a thickness of about 100 nm to 500 nm and may be, for example, formed of $Bi_2Te_3$. Further, at 485, the example method may also include growing a CHESS structure of a thickness between about 3 and 30 microns. At 490, the example method may further include cooling the CHESS structure and the substrate.

Figure 5:
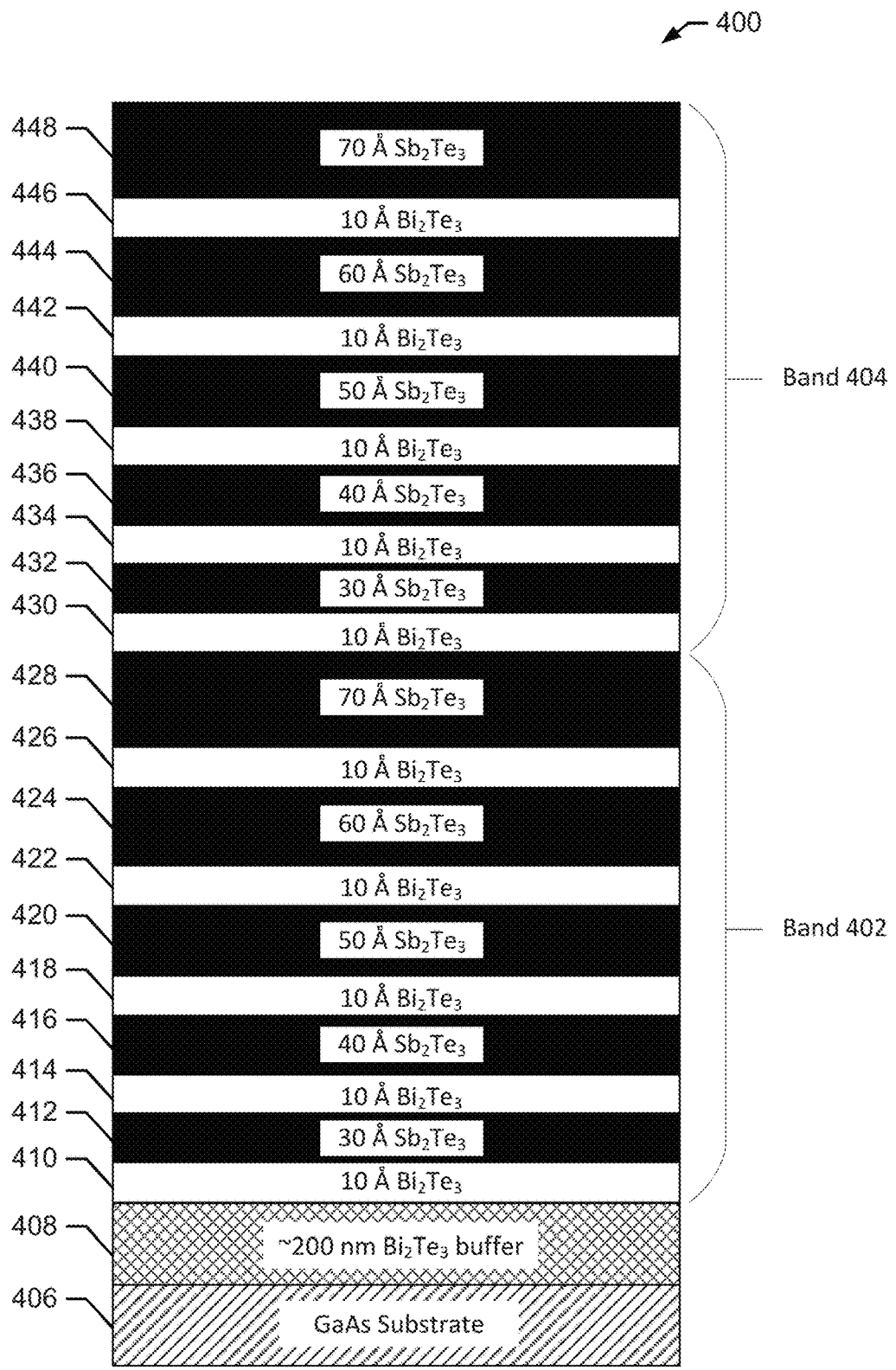
FIG. 5 shows another example superlattice structure according to an example embodiment.

FIG. 5 shows an example CHESS structure 400 that is comprised of p-type $Bi_2Te_3/Sb_2Te_3$ thin-film materials that were formed via, for example, MOCVD or MBE. As further described below, it is understood that a similar structure can be formed with the same thicknesses for a n-type structure via MOCVD or MBE. The structure 400 may be comprised of two bands 402 and 404 of superlattice periods. The structure 400 may include a GaAs substrate 406 and an approximately 200 nm thickness $Bi_2Te_3$ buffer layer 408. As part of the first band, the superlattice periods may include a 10 Å thickness $Bi_2Te_3$ layer 410 and a 30 Å thickness $Sb_2Te_3$ layer 412. In each subsequent period of the band 402, the $Bi_2Te_3$ layer may have the same thickness while the $Sb_2Te_3$ layer may increase by 10 Å. Accordingly, a ratio of the thicknesses of the layers in the first period would be, if the first $Bi_2Te_3$ layer is x, then the $Sb_2Te_3$ layer would be 3x. Subsequently, for the remaining periods in the band 402, the ratios would be x:4x, x:5x, x:6x, and x:7x.

As such, the band 402 may include layers ordered as follows and disposed on the buffer 408 with associated thicknesses: 10 Å $Bi_2Te_3$ layer 410, 30 Å $Sb_2Te_3$ layer 412; 10 Å $Bi_2Te_3$ layer 414, 40 Å $Sb_2Te_3$ layer 416; 10 Å $Bi_2Te_3$ layer 418, 50 Å $Sb_2Te_3$ layer 420; 10 Å $Bi_2Te_3$ layer 422, 60 Å $Sb_2Te_3$ layer 424; and 10 Å $Bi_2Te_3$ layer 426, 70 Å $Sb_2Te_3$ layer 428. Band 404 may include layers ordered as follows and disposed on the band 402 with associated thicknesses: 10 Å $Bi_2Te_3$ layer 430, 30 Å $Sb_2Te_3$ layer 432; 10 Å $Bi_2Te_3$ layer 434, 40 Å $Sb_2Te_3$ layer 436; 10 Å $Bi_2Te_3$ layer 438, 50 Å $Sb_2Te_3$ layer 440; 10 Å $Bi_2Te_3$ layer 442, 60 Å $Sb_2Te_3$ layer 444; and 10 Å $Bi_2Te_3$ layer 446, 70 Å $Sb_2Te_3$ layer 448.

Additionally, MBE or MOCVD for n-type $Bi_2Te_3/Bi_2Se_3$ based CHESS structures may be utilized, where deposition of the source materials and dopants can be precision-controlled at the atomic-monolayer scale. Such a structure may have a band including layers ordered as follows and disposed on a buffer with associated thicknesses: 10 Å $Bi_2Te_3$ layer, 30 Å $Bi_2Te_{3-x}Se_x$ layer; 10 Å $Bi_2Te_3$ layer, 40 Å $Bi_2Te_{3-x}Se_x$ layer; 10 Å $Bi_2Te_3$ layer, 50 Å $Bi_2Te_{3-x}Se_x$ layer; 10 Å $Bi_2Te_3$ layer, 60 Å $Bi_2Te_{3-x}Se_x$ layer; and 10 Å $Bi_2Te_3$ layer, 70 Å $Bi_2Te_{3-x}Se_x$ layer. Another band formed above may include layers ordered as follows and disposed on this second band with associated thicknesses: 10 Å $Bi_2Te_3$ layer, 30 Å $Bi_2Te_{3-x}Se_x$ layer; 10 Å $Bi_2Te_3$ layer, 40 Å $Bi_2Te_{3-x}Se_x$ layer; 10 Å $Bi_2Te_3$ layer, 50 Å $Bi_2Te_{3-x}Se_x$ layer; 10 Å $Bi_2Te_3$ layer, 60 Å $Bi_2Te_{3-x}Se_x$ layer; and 10 Å $Bi_2Te_3$ layer, 70 Å $Bi_2Te_{3-x}Se_x$ layer.

In this regard, with both p-type and n-type structures, in-situ doping may be employed for heavily-doped regions adjacent to contact layers at either ends of the thermoelectric structure, as opposed to, for example, ion-implantation which may not be desirable due to preserving the crystal quality and Seebeck coefficients, and may therefore not be suitable for device processing.

Figure 6A:
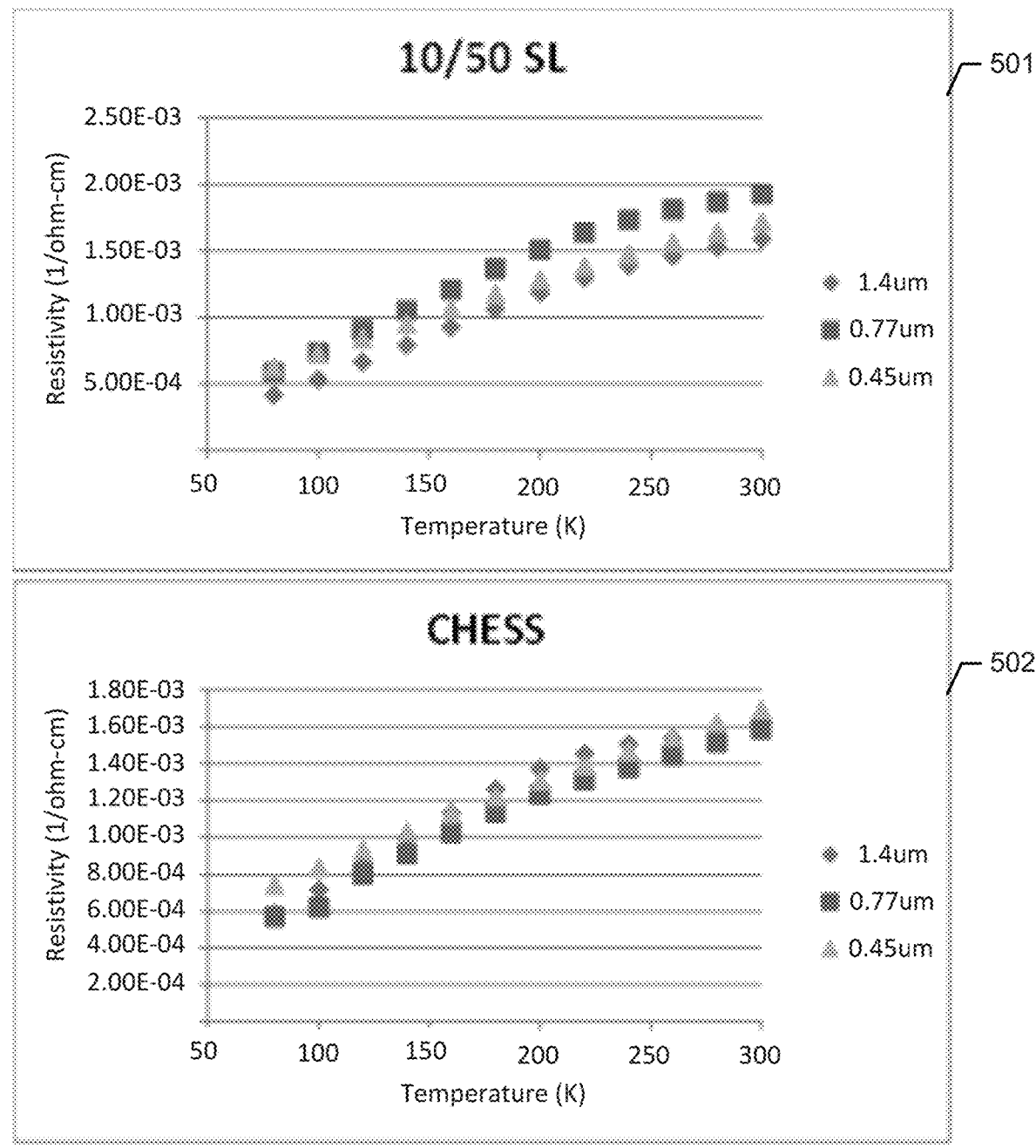
FIG. 6A shows comparative graphs of resistivity with respect to temperature according to an example embodiment.

The following provides an evaluation of some comparisons between multi-period CHESS structures described herein relative to conventional structures that employ a single, uniform period superlattice structure. In this regard, FIG. 6A shows a comparison of a conventional single uniform 10/50 superlattice structure with a CHESS structure. In this regard, FIG. 6A provides a comparison of resistivity against temperature for various structure sizes for a conventional single uniform 10/50 Å superlattice period structure in graph 501 and a CHESS structure in graph 502. It can be seen that the CHESS structure offers lower variation of electrical resistivity, i.e., 1.6e-3 Ohm-cm to 6e-4 Ohm-cm from 300K to 80K, compared to the conventional single uniform 10/50 Å superlattice period structure which goes from approximately 2e-3 Ohm-cm to 5e-4 Ohm-cm. Accordingly, this lower variation can translate into an improved preservation of the Seebeck coefficient as temperature is lowered, and therefore improved preservation of ZT between about 300K to 80K. For example, for a CHESS structure that is n-type or p-type, ZT may be greater than 1 at 300K, ZT may be greater than 0.5 at 150K, or ZT may be greater than 0.25 at 77K.

Figure 6B:
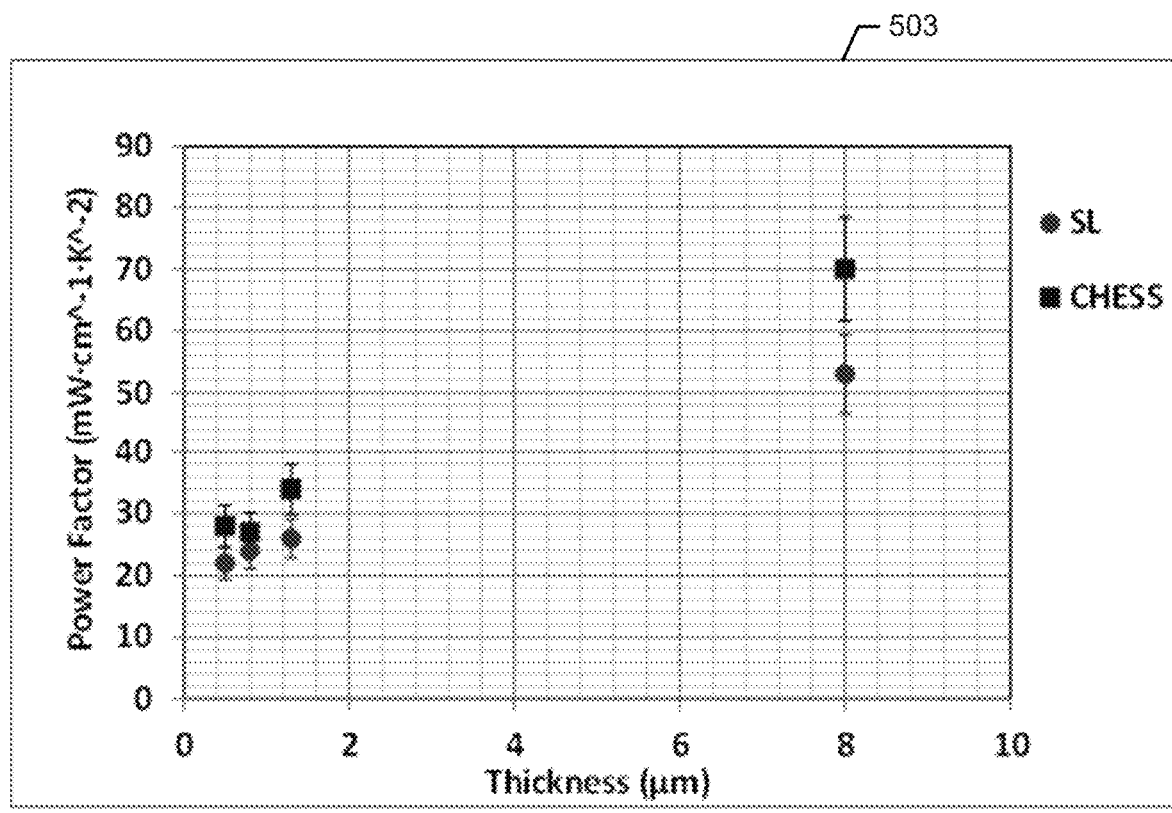
FIG. 6B shows comparative graphs of power factor with respect to thickness according to an example embodiment.

In FIG. 6B, a comparison of a CHESS structure to conventional single uniform superlattice period structure (SL), for various film thicknesses, in terms of thermoelectric power factor at 300K is shown in graph 503. The thermoelectric power factor is given by the term, $(\alpha^2/\rho)$, where $\alpha$ is the Seebeck coefficient and $\rho$ is electrical resistivity. As shown in graph 503, the CHESS structure exhibits a higher power factor for each thickness, which indicates that the CHESS structure exhibits a higher thermoelectric figure of merit (ZT).

Figure 6C:
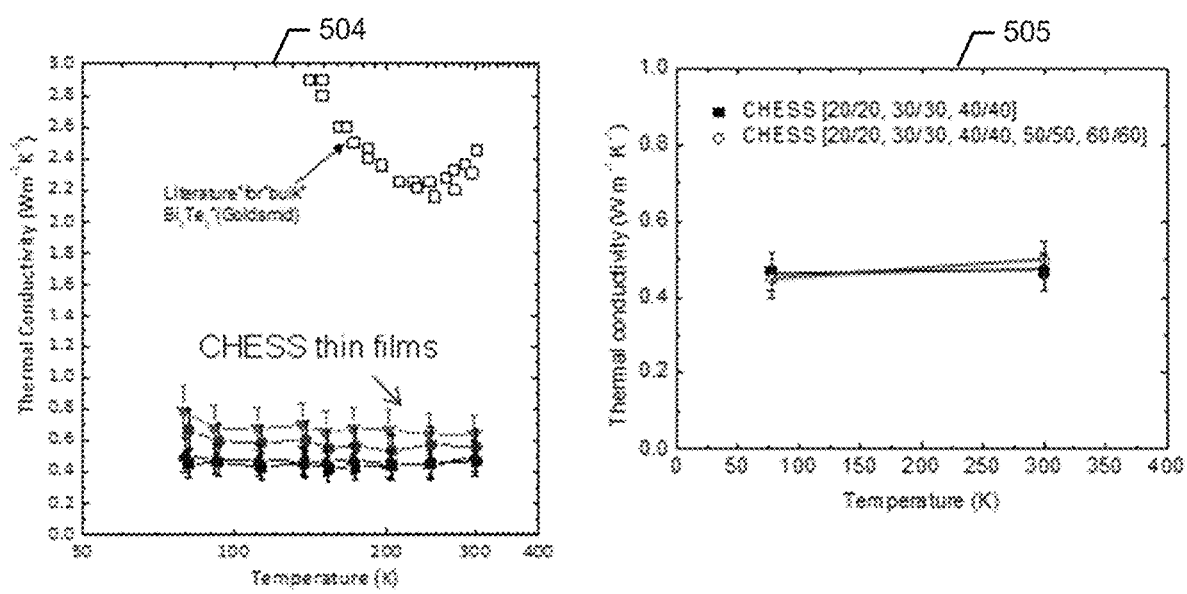
FIG. 6C shows graphs of thermal conductivity with respect to temperature according to an example embodiment.

FIG. 6C shows two graphs 504 and 505 that each show thermal conductivity against temperature for CHESS structures. As can be seen in graphs 504 and 505, the CHESS nano-scale engineered thin-film structures show lower thermal conductivity across a broad temperature range (e.g., 300K-80K) compared to bulk materials, and CHESS materials offer very little variation in thermal conductivity. Since the thermoelectric figure of merit (ZT) is inversely proportional to thermal conductivity, CHESS materials can offer much higher ZT than bulk materials or single uniform superlattice period structures. Accordingly, an improvement in the performance of cooling devices between about 300K to 80K and lower may be realized. Further, graph 505 shows that CHESS materials designed for scattering longer wavelength phonons show flat or an actual thermal conductivity reduction with lower temperature, which has not been observed in bulk materials or single uniform superlattice period structures.

Further, measurements of ZT of bulk, single uniform superlattice period structures, and thin-film CHESS p-type elements have shown the following data at 300K in Table 8.

TABLE 8

| Material | Figure of Merit (ZT) in p-type structure |
| --- | --- |
| Bulk | ~0.9 to 1.0 |
| Single uniform superlattice period structure | ~1.75 |
| Thin-film hierarchically engineered CHESS | ~2.02 |

As can be seen from Table 8, CHESS structures provide an improved ZT relative to bulk materials and single uniform superlattice period structures at 300K. The ZT improvements with the use of other CHESS aspects described above (e.g., doping gradient and bandgap gradient) can further improve the ZT of CHESS structures relative to bulk and single uniform superlattice period structures, not only at 300K but over the range of about 300K-80K for cooling devices and about 300K-400K for cooling or energy harvesting devices.

Figure 6D:
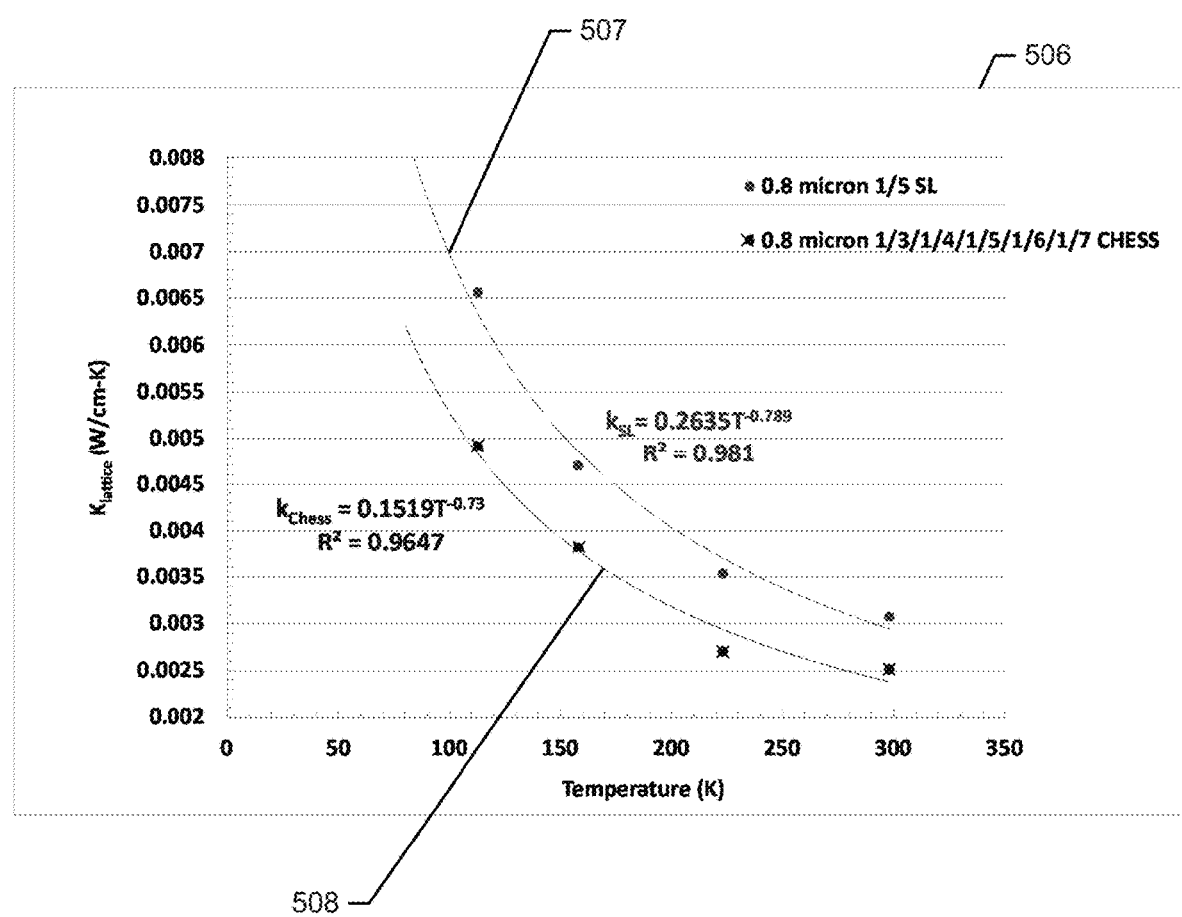
FIG. 6D shows another graph of thermal conductivity with respect to temperature according to an example embodiment.

Similarly, FIG. 6D provides another graph 506 of thermal conductivity with respect to temperature. In this regard, a line graph 508 of a CHESS structure can be compared to a line graph 507 of a conventional structure. It is noteworthy that the line graph 508 of the CHESS structure exhibits a lower thermal conductivity over the range of temperatures (e.g., from approximately 75K to 300K) relative to the line graph 507 of the conventional structure.

Figure 6E:
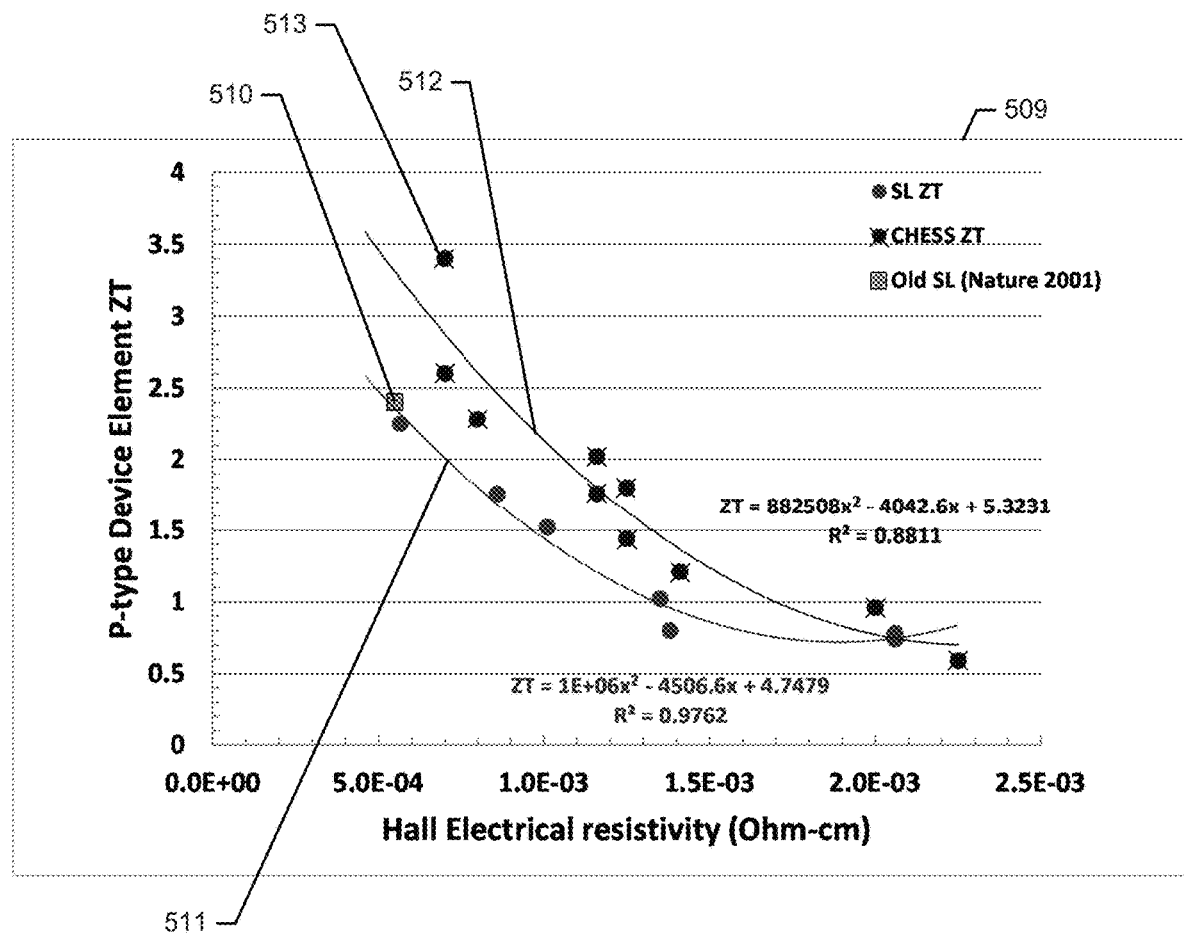
FIG. 6E shows a graph of figure of merit (ZT) with respect to Hall Electrical resistivity according to an example embodiment.

FIG. 6E provides a graph 509 of thermoelectric figure of merit (ZT) with respect to Hall Electrical resistivity for structures at 300K to draw comparisons between an example CHESS structure and conventional thermoelectric structures. In this regard, example p-type device elements are compared. The ZT relative to the Hall Electrical resistivity of a conventional (2001 era) superlattice structure is shown at point 510. Line graph 511 shows an interpolation of ZT relative to the Hall Electrical resistivity of a more recent conventional superlattice structure. Finally, line graph 512 shows an interpolation of ZT relative to the Hall Electrical resistivity of an example CHESS structure. As can be seen, the example CHESS structure is shown to have an approximate 3.4 ZT at 300K at point 513 with a structure that is 9 μm thick, a ρ (electrical resistivity) of approximately 7e-4 Ohm-cm, and an α (Seebeck coefficient) of approximately 240 μV/K.

Further comparisons of cooling performance between CHESS structures and single uniform superlattice period structures have been studied, based on similar thin-film material thicknesses, electrical and thermal contact resistivities and device processing conditions. The CHESS material have shown advantages over single uniform superlattice period structures with respect to larger cooling differentials (i.e., 49.1K for CHESS structure and 44.4K for single uniform superlattice period structure) and cooling power densities (i.e., 112 W/cm² for CHESS structure and 48.8 W/cm² for single uniform superlattice period structure). Additional advantages of CHESS structures may be shown through implementation of other aspects of the CHESS formalism—such as doping gradient and bandgap gradient—to improve the device processing methodologies (e.g., improved contacts) and utilize thicker epitaxial films, and improved electrical/thermal properties matching between p and n materials.

Having described the structure and some advantages of the various example embodiments, some additional applications for CHESS structures, such as low-temperature cooling devices for infrared focal plane arrays and other low-temperature electronics will now be described. In this regard, the improvement of ZT with CHESS structures, through better p/n matching as well as the improvement of contact resistances, can be directly applicable for evaluation of high heat-flux (e.g., greater than 1 kW/cm² at the thermoelectric cooler level) cooling in association with a simulated hot-spot. Such a hot-spot of 1.6 kW/cm² can be experimentally simulated with a 1 W thin-film heater on a 250 μm×250 μm patch on the front-side of a thin (~75 μm) Si, that would lead to about 1.1 kW/cm² at the cold-side of the thermoelectric cooler. A coefficient of performance (COP) of approximately 2 for the thermoelectric cooler, for a ΔT of 15K, means the heat-flux would be approximately 1.6 kW/cm² on the hot-side of the thermoelectric cooler. The CHESS advancements, in terms of both improved ZT of both the p- and n-type (e.g., approximately 2.6) and contact resistivities (e.g., approximately 5e-8 Ohm-cm²), can allow for the use of epitaxial film thicknesses of approximately 1 μm. The heat-flux capability in W/cm² may scale inversely with thermoelectric structure thickness. Accordingly, with CHESS structures, a target high heat-flux design may be realized, having thermoelectric film thickness of approximately 1 μm, contact resistivity of approximately 5e-8 Ohm-cm$^2$, heat flux of approximately (8/1)*200 or approximately 1600 W/cm$^2$ with a COP of approximately 2 for a ΔT across the thermoelectric cooler of approximately 15K. Such metrics can meet high-performance computing (HPC) and high-power GaN radio frequency device requirements.

Further, according to some example embodiments, CHESS structures may facilitate the ability to generate high efficiency energy harvesters in combination with, for example, textiles and fabrics. With the advent of battery powered communication devices and the demand for reduced power consumption, the necessary power has been reduced to a point where significant data processing is possible with mWs of power. Similarly, micro-electro-mechanical systems have created ultra-low power sensor capabilities. These, combined with high efficiency batteries and energy harvesting have reached the point where significant capability can be built into a small device, and CHESS structures may operate to assist with cooling among other functions.

Many modifications and other embodiments of the invention set forth herein will come to mind to one skilled in the art to which the present application pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements or functions, it should be appreciated that different combinations of elements or functions may be provided by alternative embodiments without departing from the scope of the appended claims. In this regard, for example, different combinations of elements or functions than those explicitly described above are also contemplated as may be set forth in some of the appended claims. In cases where advantages, benefits or solutions to problems are described herein, it should be appreciated that such advantages, benefits or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A thin-film structure comprising:
a plurality of superlattice periods, each superlattice period comprising a first material layer disposed adjacent to a second material layer;
wherein the plurality of superlattice periods comprises:
a first superlattice period wherein a thickness of a first material layer of the first superlattice period is x and a thickness of a second material layer of the first superlattice period is 3x;
a second superlattice period disposed adjacent the first superlattice period, wherein a thickness of a first material layer of the second superlattice period is x and a thickness of a second material layer of the second superlattice period is 4x;
a third superlattice period disposed adjacent the second superlattice period, wherein a thickness of a first material layer of the third superlattice period is x and a thickness of a second material layer of the third superlattice period is 5x;
a fourth superlattice period disposed adjacent the third superlattice period, wherein a thickness of a first material layer of the fourth superlattice period is x and a thickness of a second material layer of the fourth superlattice period is 6x; and
a fifth superlattice period disposed adjacent the fourth superlattice period, wherein a thickness of a first material layer of the fifth superlattice period is x and a thickness of a second material layer of the fifth superlattice period is 7x.

2. The thin-film structure of claim 1, wherein, for each superlattice period, the first material layer is $Bi_2Te_3$.

3. The thin-film structure of claim 1, wherein, for each superlattice period, the second material layer is $Sb_2Te3$ or $Bi_2Te_{3-x}Se_x$.

4. The thin-film structure of claim 1, wherein, for each superlattice period, the first material layer and the second material layer are periodic table Group IV-VI compounds.

5. The thin-film structure of claim 1, wherein, for each superlattice period, the first material layer and the second material layer are doped to be n-type semiconductor materials.

6. The thin-film structure of claim 1, wherein, for each superlattice period, the first material layer and the second material layer are doped to be p-type semiconductor materials.

7. The thin-film structure of claim 1, wherein the plurality of superlattice periods is a first plurality of superlattice periods;
wherein the thin-film structure comprises a first band comprising the first plurality of superlattice periods and a second band comprising a second plurality of superlattice periods;
wherein the first band is adjacent to the second band; and
wherein the first plurality of superlattice periods of the first band and second plurality of superlattice periods of the second band have a same arrangement and thicknesses of material layers.

8. The thin-film structure of claim 1, wherein the thin-film structure is part of a thermoelectric leg further comprising a bandgap gradient along the thermoelectric leg.

9. The thin-film structure of claim 1, wherein the thin-film structure is part of a thermoelectric leg further comprising a doping gradient along the thermoelectric leg.

10. The thin-film structure of claim 1, wherein the thin-film structure is a component of a cooler device configured to perform thermal control, thermal sensing, or energy harvesting in an electronic device, an optoelectronic device, a photonic device, a computing device, a radio frequency device, ef-a biological platform, a micro-electro-mechanical system (MEMS), a battery system, or a sensor device.

* * * * *